(12) United States Patent
Morrison et al.

(10) Patent No.: US 8,599,559 B1
(45) Date of Patent: Dec. 3, 2013

(54) CAGE WITH A HEAT SINK MOUNTED ON ITS MOUNTING SIDE AND AN EMI GASKET WITH ITS FINGERS ELECTRICALLY CONNECTED TO THE MOUNTING SIDE

(75) Inventors: Matthew David Morrison, Lemoyne, PA (US); Michael John Phillips, Camp Hill, PA (US); Michael Eugene Shirk, Grantville, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 7 days.

(21) Appl. No.: 13/483,338

(22) Filed: May 30, 2012

(51) Int. Cl.
*H05K 7/20* (2006.01)

(52) U.S. Cl.
USPC .......................................................... 361/702

(58) Field of Classification Search
USPC ........ 439/487, 607.01; 385/92; 361/702–704, 361/715
See application file for complete search history.

(56) References Cited

U.S. PATENT DOCUMENTS

| | | | |
|---|---|---|---|
| 6,205,026 B1 | 3/2001 | Wong et al. | 361/704 |
| 6,208,515 B1 * | 3/2001 | Klein | 361/704 |
| 6,816,376 B2 | 11/2004 | Bright et al. | 361/704 |
| 7,073,960 B2 * | 7/2006 | Anderl et al. | 385/92 |
| 7,314,318 B2 * | 1/2008 | Anderl et al. | 385/92 |
| 7,355,857 B2 | 4/2008 | Pirillis et al. | 361/715 |
| 8,382,509 B2 * | 2/2013 | David et al. | 439/487 |
| 2012/0300403 A1 * | 11/2012 | Scholeno | 361/702 |
| 2013/0033821 A1 * | 2/2013 | Szczesny et al. | 361/704 |

\* cited by examiner

*Primary Examiner* — Chandrika Prasad

(57) ABSTRACT

A cage assembly is provided for receiving a pluggable module. The cage assembly includes a cage having a front end, a mounting side, and an internal compartment. The front end is open to the internal compartment of the cage. The internal compartment is configured to receive the pluggable module therein through the front end. A heat sink is mounted to the mounting side of the cage. The heat sink has a module side that is configured to thermally communicate with the pluggable module. An electromagnetic interference (EMI) gasket extends along at least a portion of an interface between the mounting side of the cage and the module side of the heat sink. The EMI gasket includes electrically conductive spring fingers that are engaged with and electrically connected to the mounting side of the cage.

20 Claims, 8 Drawing Sheets

US 8,599,559 B1

CAGE WITH A HEAT SINK MOUNTED ON ITS MOUNTING SIDE AND AN EMI GASKET WITH ITS FINGERS ELECTRICALLY CONNECTED TO THE MOUNTING SIDE

BACKGROUND OF THE INVENTION

The subject matter described and/or illustrated herein relates generally to pluggable modules, and more particularly to cage assemblies for receiving pluggable modules.

Various types of fiber optic and copper based transceiver assemblies that permit communication between host equipment and external devices are known. These transceiver assemblies typically include a pluggable module that is received within a receptacle assembly, which includes a receptacle connector that pluggably connects to the pluggable module. The receptacle assembly typically includes a metal cage having an internal compartment that receives the pluggable module therein. The receptacle connector is held in the internal compartment of the cage for connection with the pluggable module as the pluggable module is inserted therein.

Due to increases in the density, power output levels, and/or switching speeds of some pluggable modules, there may be a corresponding increase in heat generated by the pluggable module. The heat generated by the operation of the pluggable modules can lead to significant problems. For example, some pluggable modules may lose performance, or outright fail, if the core temperature of the module rises too high. Known techniques used to control the temperature of pluggable modules include mounting a heat sink to the cage. When the pluggable module is received within the receptacle assembly, the heat sink thermally communicates (e.g., engages) with the pluggable module to dissipate heat from the module. But, electromagnetic interference (EMI) emissions may leak out of the receptacle assembly at an interface between the cage and the heat sink.

There is a need for a receptacle assembly that reduces leakage of EMI emissions through an interface between a cage and a heat sink of the receptacle assembly.

BRIEF DESCRIPTION OF THE INVENTION

In one embodiment, a cage assembly is provided for receiving a pluggable module. The cage assembly includes a cage having a front end, a mounting side, and an internal compartment. The front end is open to the internal compartment of the cage. The internal compartment is configured to receive the pluggable module therein through the front end. A heat sink is mounted to the mounting side of the cage. The heat sink has a module side that is configured to thermally communicate with the pluggable module. An electromagnetic interference (EMI) gasket extends along at least a portion of an interface between the mounting side of the cage and the module side of the heat sink. The EMI gasket includes electrically conductive spring fingers that are engaged with and electrically connected to the mounting side of the cage.

In another embodiment, a receptacle assembly is provided for mating with a pluggable module. The receptacle assembly includes a receptacle connector and a cage having a front end, a mounting side, and an internal compartment. The receptacle connector is held within the internal compartment. The front end is open to the internal compartment of the cage. The internal compartment is configured to receive the pluggable module therein through the front end. A heat sink is mounted to the mounting side of the cage. The heat sink has a module side that is configured to thermally communicate with the pluggable module. An electromagnetic interference (EMI) gasket extends along at least a portion of an interface between the mounting side of the cage and the module side of the heat sink. The EMI gasket includes electrically conductive spring fingers that are engaged with and electrically connected to the mounting side of the cage.

In another embodiment, a cage assembly is provided for receiving a pluggable module. The cage assembly includes a cage having a front end, a mounting side, and an internal compartment. The front end is open to the internal compartment of the cage. The internal compartment is configured to receive the pluggable module therein through the front end. A heat sink is mounted to the mounting side of the cage. The heat sink has a module side that is configured to thermally communicate with the pluggable module. An electromagnetic interference (EMI) gasket extends along at least a portion of an interface between the mounting side of the cage and the module side of the heat sink. The EMI gasket includes a base having a perimeter that includes a corner. The EMI gasket also includes electrically conductive spring fingers that extend from the base and are engaged with and electrically connected to the mounting side of the cage. The spring fingers include a corner spring finger that extends from the base at the corner of the perimeter.

DETAILED DESCRIPTION OF THE INVENTION

Figure 1:
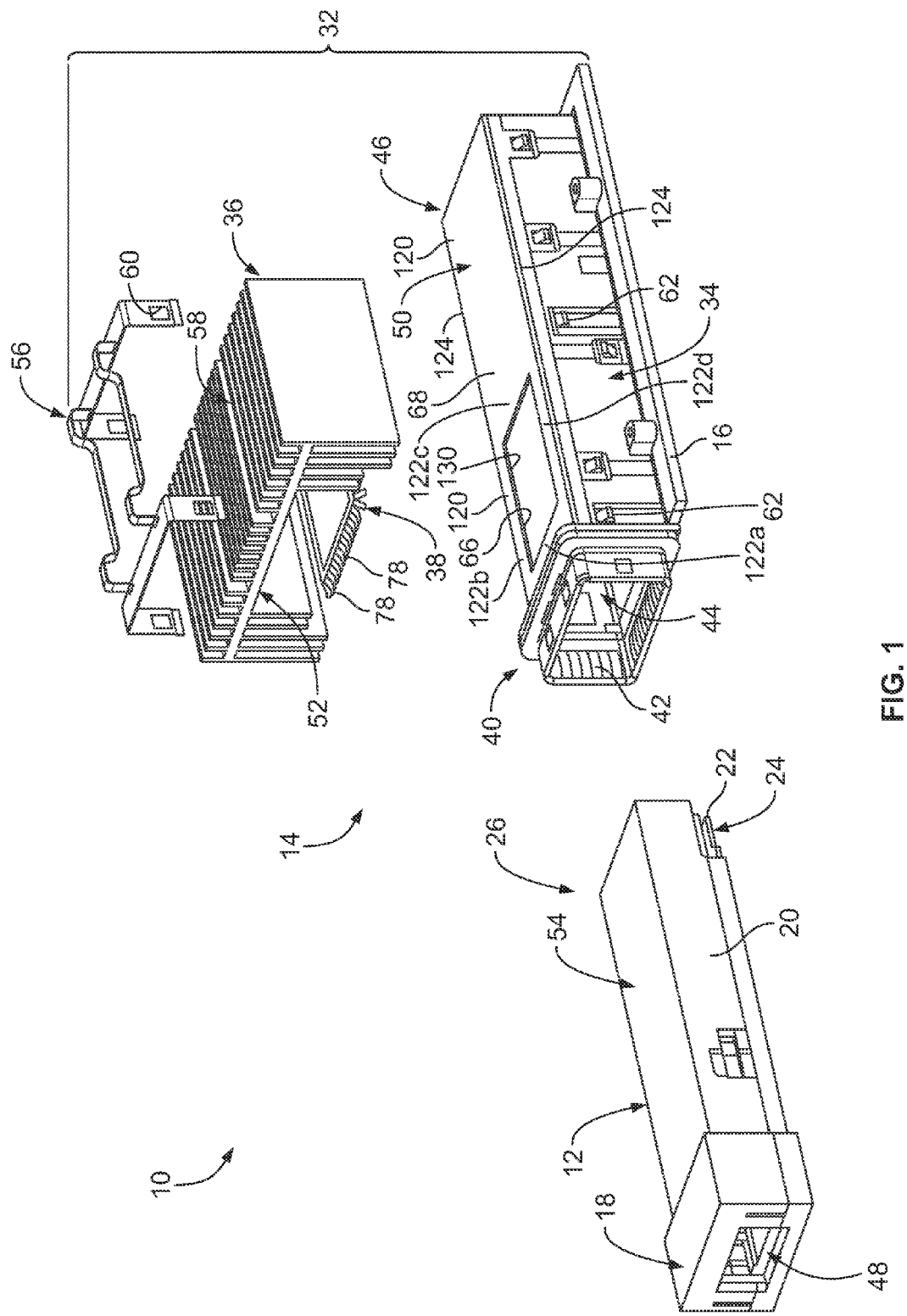
FIG. 1 is a partially exploded perspective view of an exemplary embodiment of a transceiver assembly.

FIG. 1 is a partially exploded perspective view of a portion of an exemplary embodiment of a transceiver assembly 10. In the exemplary embodiment, the transceiver assembly 10 is adapted to address, among other things, conveying data signals at high rates, such as data transmission rates of at least 10 gigabits per second (Gbps), which is required by the SFP+ standard. For example, in some embodiments the transceiver assembly 10 is adapted to convey data signals at a data transmission rate of at least 28 Gbps. Moreover, and for example, in some embodiments the transceiver assembly 10 is adapted to convey data signals at a data transmission rate of between approximately 20 Gbps and approximately 30 Gbps. It is appreciated, however, that the benefits and advantages of the subject matter described and/or illustrated herein may accrue equally to other data transmission rates and across a variety of systems and standards. In other words, the subject matter described and/or illustrated herein is not limited to data transmission rates of 10 Gbps or greater, any standard, or the exemplary type of transceiver assembly shown and described herein.

The transceiver assembly 10 includes one or more pluggable modules 12 configured for pluggable insertion into a receptacle assembly 14 that is mounted to a host circuit board 16. The host circuit board 16 may be mounted in a host system (not shown) such as, but not limited to, a router, a server, a computer, and/or the like. The host system typically includes a conductive chassis (not shown) having a panel (not shown) including one or more openings (not shown) extending therethrough in substantial alignment with the receptacle assembly 14. The receptacle assembly 14 is optionally electrically connected to the panel.

The pluggable module 12 is configured to be inserted into the receptacle assembly 14. Specifically, the pluggable module 12 is inserted into the receptacle assembly 14 through the panel opening such that a front end 18 of the pluggable module 12 extends outwardly from the receptacle assembly 14. The pluggable module 12 includes a housing 20 that forms a protective shell for one or more circuit boards 22 disposed within the housing 20. The circuit board 22 carries circuitry, traces, paths, devices, and/or the like that perform transceiver functions in a known manner. An edge 24 of the circuit board 22 is exposed at a rear end 26 of the housing 20. A straddle mount connector (not shown) may be mounted to the circuit board 22 and exposed at the rear end 26 of the housing 20 for plugging into a receptacle connector 28 (FIG. 7) of the receptacle assembly 14. Alternatively, the circuit board 22 of the pluggable module 12 may directly mate with the receptacle connector 28. In other words, in some embodiments, the edge 24 of the circuit board 22 of the pluggable module 12 is received within a corresponding receptacle 30 (FIG. 7) of the receptacle connector 28 to electrically connect the pluggable module 12 to the receptacle connector 28.

In general, the pluggable module 12 and the receptacle assembly 14 may be used in any application requiring an interface between a host system and electrical and/or optical signals. The pluggable module 12 interfaces to the host system via the receptacle connector 28 of the receptacle assembly 14, which includes the receptacle connector 28 and a cage assembly 32. The cage assembly 32 includes an electrically conductive cage 34 (which is sometimes referred to as a "receptacle guide frame" or a "guide frame"), a heat sink 36, and an electromagnetic interference (EMI) gasket 38. The cage 34 includes a front end 40 having one or more front openings, or ports, 42 that are open to one or more internal compartments 44 of the cage 34. The front end 40 of the cage 34 is configured to be mounted, or received, within the opening in the panel of the hose system. The receptacle connector 28 is positioned within the internal compartment 44 at a rear end 46 of the cage 34. The internal compartment 44 of the cage 34 is configured to receive the pluggable module 12 therein in electrical connection with the receptacle connector 28. The cage 34 may include any number of internal compartments 44 and ports 42, arranged in any pattern, configuration, arrangement, and/or the like (such as, but not limited to, any number of rows and/or columns), for electrically connecting any number of pluggable modules 12 to the host circuit board.

The pluggable module 12 interfaces to one or more optical cables (not shown) and/or one or more electrical cables (not shown) through a connector interface 48 at the front end 18 of the module 12. Optionally, the connector interface 48 comprises a mechanism that cooperates with a fiber or cable assembly (not shown) to secure the fiber or cable assembly to the pluggable module 12. Suitable connector interfaces 48 are known and include adapters for the LC style fiber connectors and the MTP/MPO style fiber connectors offered by Tyco Electronics Corporation (Harrisburg, Pa.).

The heat sink 36 is mounted to the cage 34. More specifically, the heat sink 36 is mounted to a mounting side 50 of the cage 34. When the pluggable module 12 is received within the internal compartment 44 of the cage 34, a module side 52 of the heat sink 36 thermally communicates with the pluggable module 12. Heat generated by the pluggable module 12 is dissipated by the heat sink 36 via the thermal communication between the heat sink 36 and the pluggable module 12. The cage 34 includes an opening 66 that extends through an upper wall 68 of the cage 34 that includes the mounting side 50. The opening 66 thereby extends through the mounting side 50. The heat sink 36 is mounted to the mounting side 50 of the cage 34 at the opening 66 such that the opening 66 enables the heat sink 36 to thermally communicate with the pluggable module 12.

In the exemplary embodiment, the heat sink 36 thermally communicates with the pluggable module 12 via engagement of the heat sink 36 with the pluggable module 12. More specifically, the module side 52 of the heat sink 36 engages a side 54 of the housing 20 of the pluggable module 12 to thermally communicate the heat sink 36 with the pluggable module 12. In some alternative embodiments, the module side 52 of the heat sink 36 thermally communicates with the pluggable module 12 via a thermal interface material (not shown) that is positioned between, and engaged with each of, the module side 52 of the heat sink 36 and the side 54 of the pluggable module 12. The thermal interface material may increase the thermal transfer efficiency between the pluggable module 12 and the heat sink 36.

As can be seen in FIG. 1, the heat sink 36 is mounted to the cage 34 using one or more mounting clips 56 that extend over a side 58 of the heat sink 36 and engage the cage 34. The mounting clips 56 include one or more mounting features 60 that cooperate with one or more complementary mounting features 62 of the cage 34 using a snap-fit connection to hold the heat sink 36 to the cage 34. In addition or alternative to the mounting clips 56, the mounting features 60, the mounting features 62, and/or the snap-fit connection, the heat sink 36 may be mounted to cage 34 using any other structure, means, fasteners, and/or the like, such as, but not limited to, using a threaded fastener, another type of non-threaded fastener, an interference fit, a latch, and/or the like.

As will be described in more detail below, the EMI gasket 38 extends along at least a portion of an interface 64 (FIGS. 5, 6, and 8) between the mounting side 50 of the cage 34 and the module side 52 of the heat sink 36. The EMI gasket 38 is positioned to facilitate blocking EMI leakage at the interface 64. The EMI gasket 38 includes electrically conductive spring fingers 78 that are engaged with and electrically connected to the mounting side 50 of the cage 34.

Figure 2:
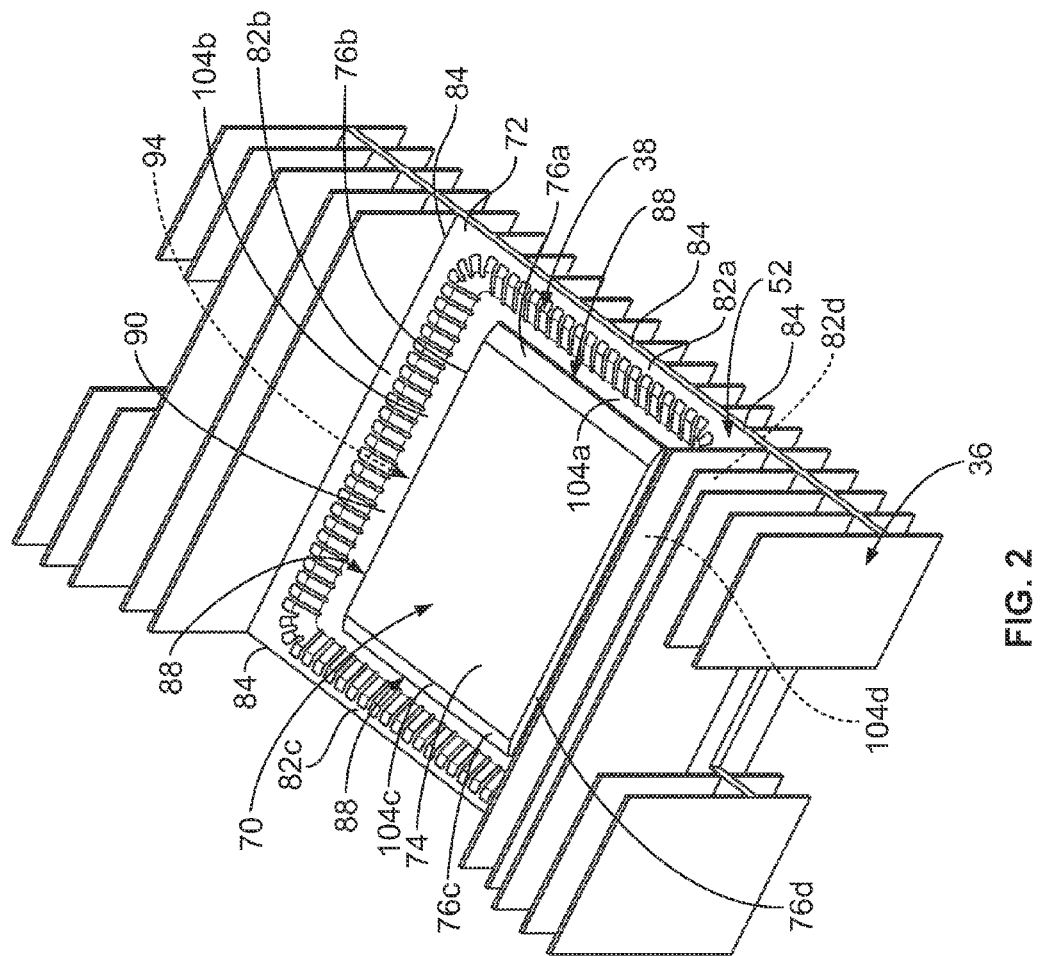
FIG. 2 is a perspective view illustrating exemplary embodiments of a heat sink and an electromagnetic interference (EMI) gasket of the transceiver assembly shown in FIG. 1.
Figure 6:
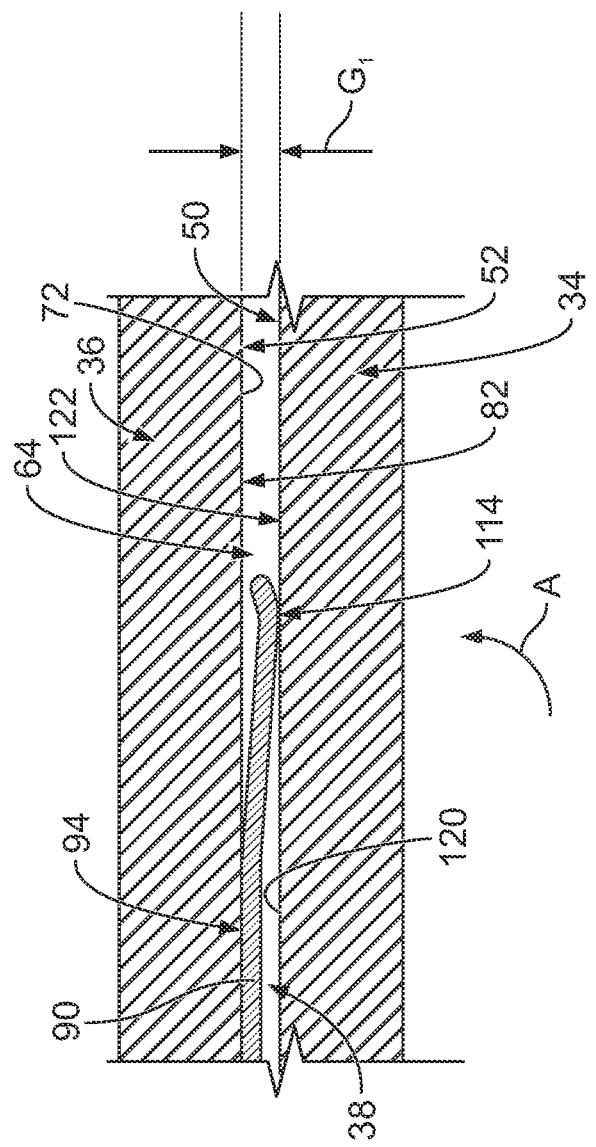
FIG. 6 is a cross-sectional view taken along line 6-6 of FIG. 4 and also illustrating the EMI gasket shown in FIGS. 2 and 3 held between the heat sink and the cage.
Figure 7:
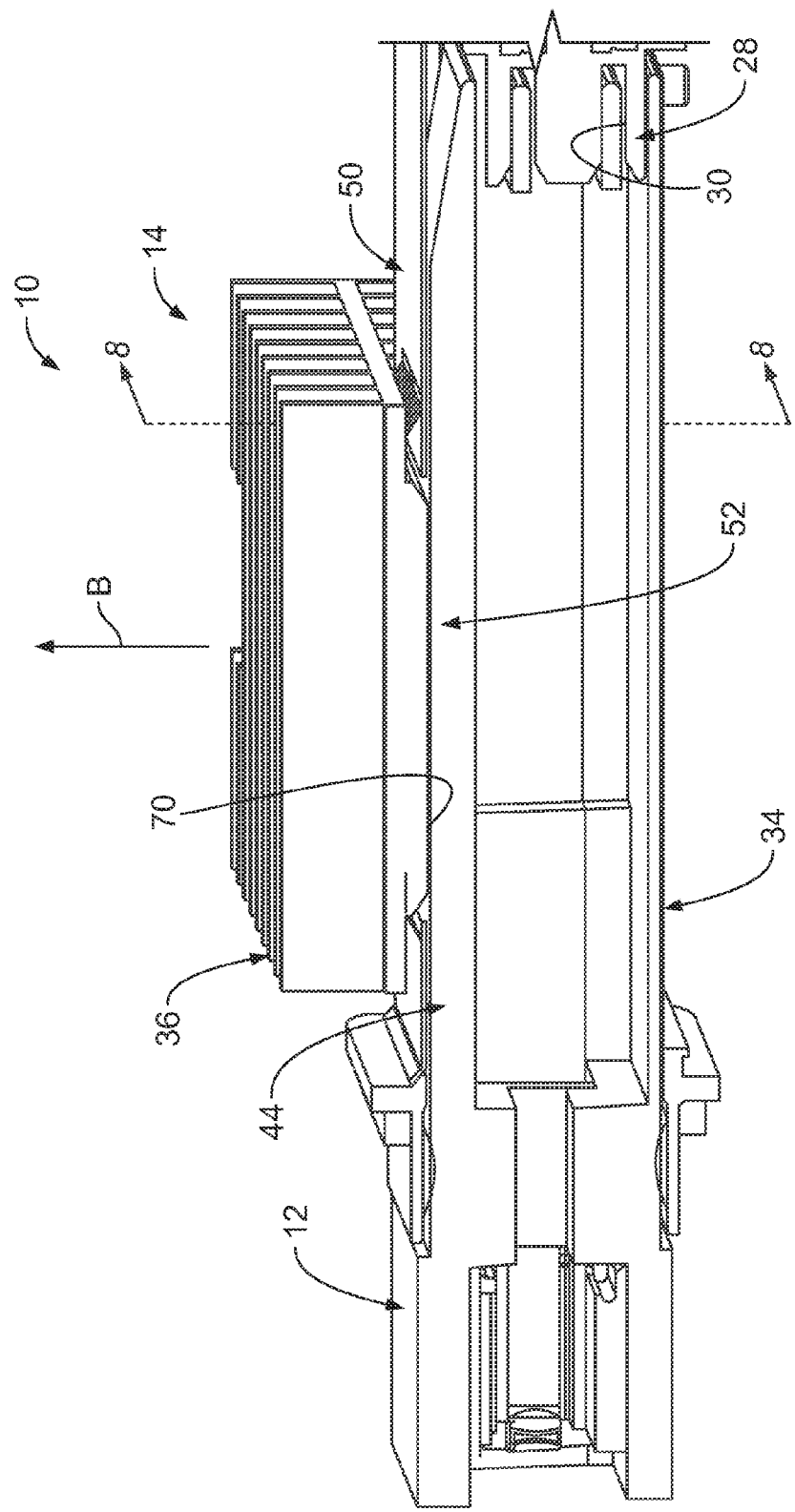
FIG. 7 is a cross-sectional view of the transceiver assembly shown in FIG. 1.

FIG. 2 is a perspective view illustrating the heat sink 36 and the EMI gasket 38. FIG. 2 illustrates the module side 52 of the heat sink 36 with the EMI gasket 38 being mounted thereto. The module side 52 of the heat sink 36 includes a platform 70. The platform 70 extends outwardly on the module side 52 from a sink surface 72 of the module side 52 to a module surface 74 of the platform 70. Side walls 76 of the platform 70 extend from the sink surface 72 to the module surface 74. The side walls 76 define a perimeter 88 of the platform 70. As will be described below, in the exemplary embodiment, the platform 70 of the heat sink 36 extends into the opening 66 (FIGS. 1 and 5) of the cage 34 (FIGS. 1 and 4-8) for thermally communicating with the pluggable module 12. In the exemplary embodiment, the module surface 74 of the platform 70 is configured to thermally communicate with the pluggable module 12 (FIGS. 1 and 7). For example, the module surface 74 of the platform 70 may be configured to engage the side 54 (FIG. 1) of the housing 20 (FIG. 1) of the pluggable module 12 to thermally communicate the heat sink 36 with the pluggable module 12. Moreover, and for example, the module surface 74 alternatively may be configured to engage a thermal interface material (not shown) that also engages the side 54 of the pluggable module 12.

The sink surface 72 of the module side 52 of the heat sink 36 includes segments 82a, 82b, 82c, and 82d that intersect a perimeter edge 84 of the sink surface 72. As will be described in more detail below, the segments 82a-d define portions of the interface 64 between the mounting side 50 (FIGS. 1 and 4-8) of the cage 34 and the module side 52 of the heat sink 36.

In the exemplary embodiment, the platform 70 includes four side walls 76a, 76b, 76c, and 76d, such that the platform 70 generally has the overall shape of a parallelepiped. But, the platform 70 may include any number of side walls 76 that provides the platform 70 with any other overall shape, which may or may not be complementary with the shape of the opening 66 within the cage 34. While in the exemplary embodiment the sink surface 72 of the module side 52 of the heat sink 36 includes four segments 82a, 82b, 82c, and 82d that extend along a generally rectangular path along the module side 52, the surface 72 may include any number of segments 82 arranged in any other shape than is shown herein, wherein such other shape may or may not be complementary with the shape of the EMI gasket 38 and/or the cage 34.

Figure 3:
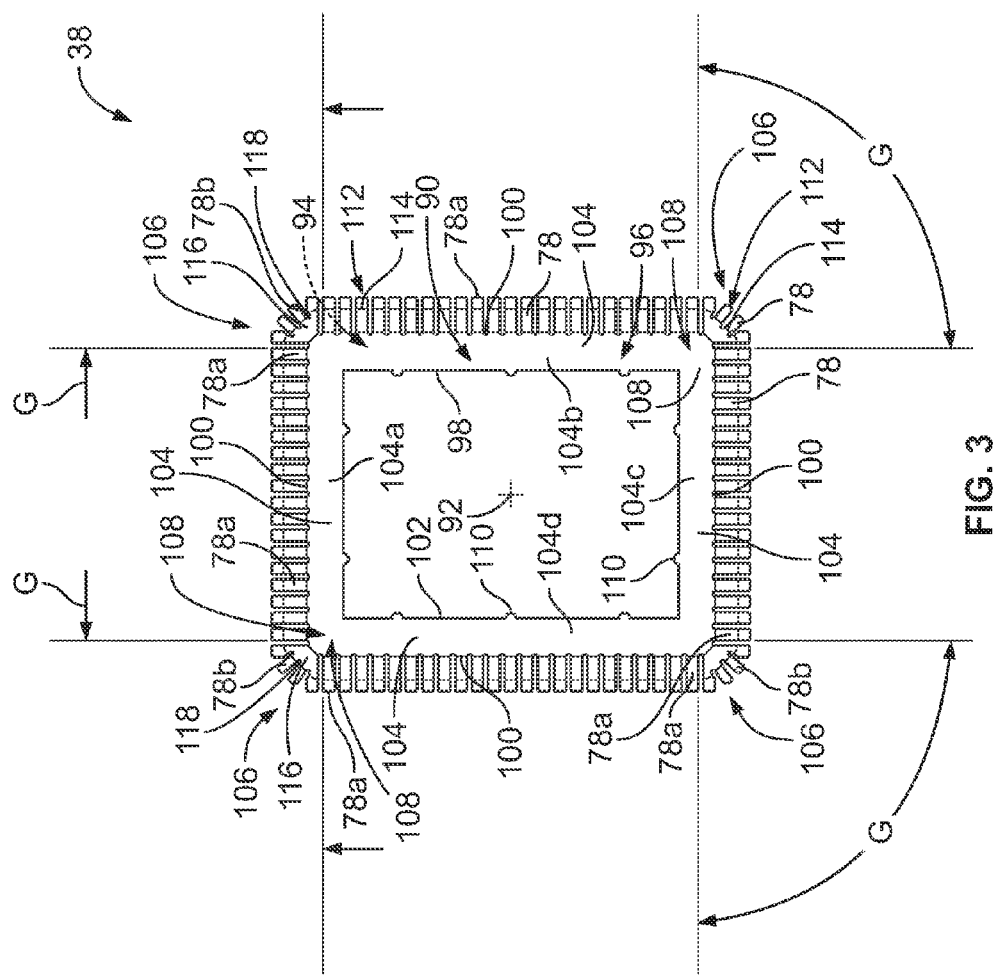
FIG. 3 is a plan view of the EMI gasket shown in FIG. 2.

FIG. 3 is a plan view of the EMI gasket 38. The EMI gasket 38 includes a base 90 and the electrically conductive spring fingers 78. The base 90 extends along a central axis 92 from a side 94 and an opposite side 96. The side 94 of the base 90 is configured to engage the sink surface 72 (FIGS. 2, 5, 6, and 8) of the module side 52 (FIGS. 1, 2, and 4-8) of the heat sink 36 (FIGS. 1, 2, and 4-8). The base 90 includes a central opening 98 that is configured to receive the platform 70 (FIGS. 2 and 7) of the heat sink 36 therein. The base 90 includes a perimeter 100 and an interior edge 102. The base 90 is defined by one or more segments 104. In the exemplary embodiment, the base 90 includes four segments 104, namely the segments 104a, 104b, 104c, and 104d. The perimeter 100 includes one or more corners 106. In the exemplary embodiment, the perimeter 100 includes four corners 106. Ends 108 of adjacent segments 104 are interconnected at corresponding ones of the corners 106. Each of the segments 104a-d may be referred to herein as a "first" and/or a "second" segment.

The base 90 may include one or more interference ribs 110 that extend from the interior edge 102 of the base 90 into the central opening 98. In other words, the interference ribs 110 extend from the interior edge 102 radially inward relative to the central axis 92. The interference ribs 110 are configured to engage the side walls 76 (FIG. 2) of the platform 70 of the heat sink 36 to mechanically connect the EMI gasket 38 to the module side 52 of heat sink 36, as will be described below.

Figure 5:
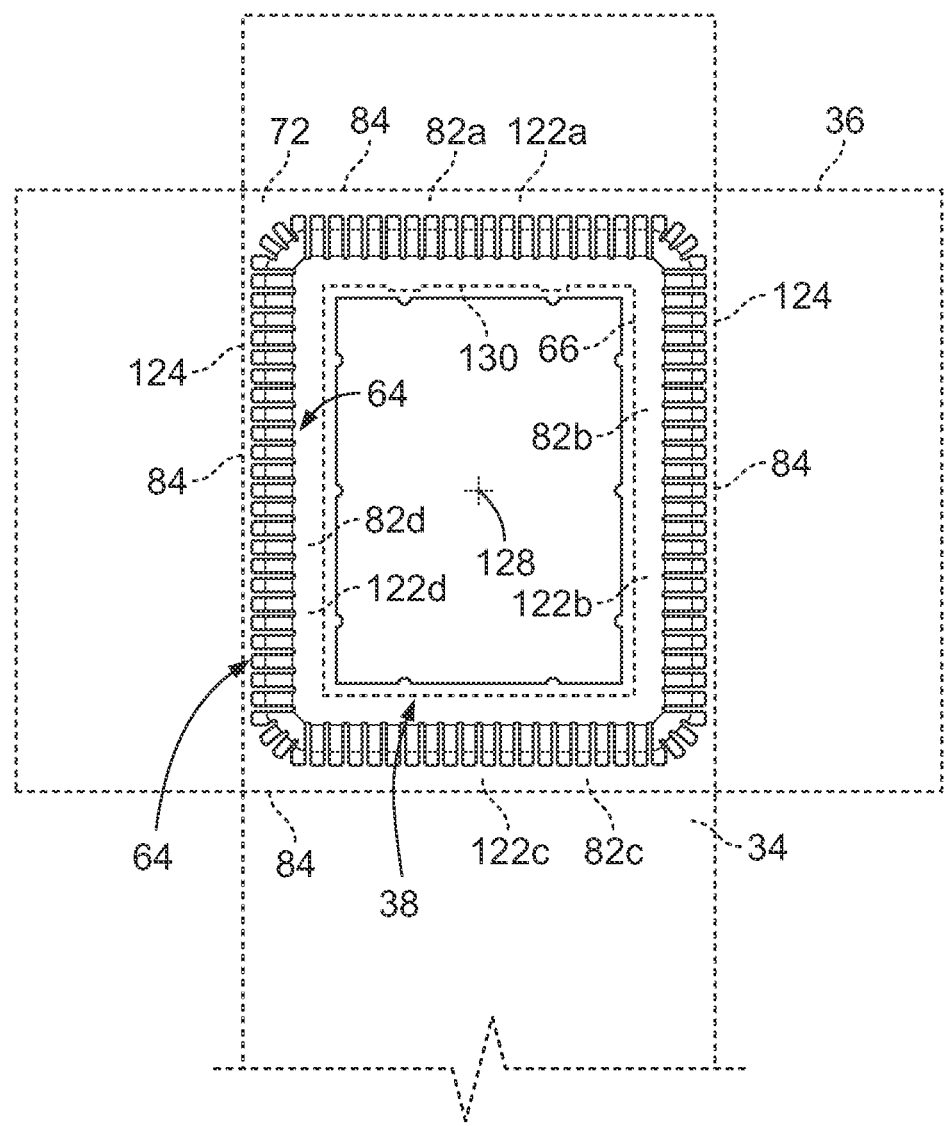
FIG. 5 is a schematic view illustrating the EMI gasket shown in FIGS. 2 and 3 held between the heat sink shown in FIG. 2 and an exemplary embodiment of a cage of the transceiver assembly shown in FIG. 1.
Figure 8:
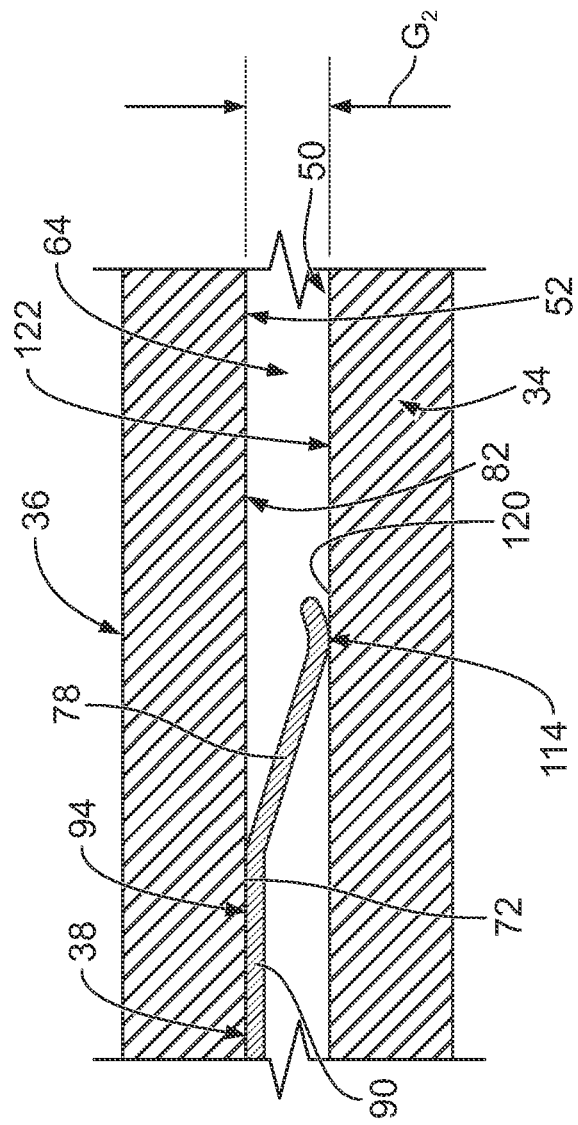
FIG. 8 is a cross-sectional view taken along line 8-8 of FIG. 7.

In the exemplary embodiment, the segments 104a-d of the base 90 define a single continuous structure. Alternatively, one or more segments 104a, 104b, 104c, and/or 104d is separate and distinct from one or more other segments 104a, 104b, 104c, and/or 104d. As used herein, a segment 104 is "separate and distinct" from another segment 104 if the segments 104 do not form a continuous structure. Segments 104 that are separate and distinct from each other may engage each other and/or be mechanically connected together with a suitable fastener (e.g., an adhesive, a clip, and/or the like) when the EMI gasket 38 is positioned along the interface 64 (FIGS. 5, 6, and 8).

The electrically conductive spring fingers 78 extend outward from the base 90. Specifically, the spring fingers 78 extend radially outward (relative to the central axis 92) from the perimeter 100 of the base 90. In the exemplary embodiment, the spring fingers 78 extend from the base 90 along an approximate entirety of the length of the perimeter 100 of the base 90. But, in some alternative embodiments, only one or more portions of the length of the perimeter 100 includes spring fingers 78 extending therefrom.

The spring fingers 78 extend from the base 90 to free ends 112. Each spring finger 78 includes an interface 114 at which the spring finger 78 is configured to engage the mounting side 50 (FIGS. 1, 4, and 6-8) of the cage 34 (FIGS. 1 and 4-8). The free end 112 and the interface 114 of each spring finger 78 is resiliently deflectable in the direction of the arrow A in FIG. 3 from a natural resting position to a deflected position. The spring fingers 78 are shown in the natural resting positions in FIG. 3. As will be described below, the spring fingers 78 are resiliently compressible between the mounting side 50 of the cage 34 and the module side 52 of the heat sink 36.

The spring fingers 78 include spring fingers 78a that extend from the segments 104a-104d of the base 90 and spring fingers 78b that extend from the base 90 at the corners 106 of the perimeter 100. In the exemplary embodiment, each segment 104a-104d of the base 90 includes a plurality of spring fingers 78 that extend therefrom. A spring finger 78a extends from the base 90 at each end 108 of each segment 104a-104d. A gap G is defined at each corner 106 between the spring fingers 78a that extends at the ends 108 of the adjacent segments 104. As can be seen in FIG. 3, the spring fingers 78b extend within the gap G of the corresponding corner 106. The spring fingers 78b may facilitate reducing an amount of EMI leakage that leaks through the corners 106 of the EMI gasket 38. Each of the spring fingers 78b may be referred to herein as a "corner spring finger", while each of the spring fingers 78a that extends at an end 108 of a segment 104 may be referred to herein as an "end spring finger".

Any number of spring fingers 78b may extend within each gap G. In other words, each corner 106 may include any number of spring fingers 78b. In the exemplary embodiment, a plurality of spring fingers 78b extend within each gap G such that each corner 106 includes a plurality of spring fingers 78b. The spring fingers 78b of each corner 106 may have any pattern, arrangement, geometry, and/or the like within the corresponding gap G. In the exemplary embodiment, at least one spring finger 78b of each corner 106 extends from the base 90 at an oblique angle relative to at least one of the spring fingers 78a, as is illustrated in FIG. 3. One example of a pattern, arrangement, and/or the like of spring fingers 78b within a gap G includes the fan-shaped pattern shown herein. Specifically, the spring fingers 78b extend along the corresponding corner 106 in a fan-shaped pattern wherein the spring fingers 78b extend along radii that are incrementally spaced-apart along the corner 106. Other patterns, arrangements, and/or the like of the spring fingers 78b within a gap G may be provided.

The spring fingers 78b optionally extend from corner sheets 116 that extend from the perimeter 100 of the base 90 at the corners 106. Specifically, at each corner 106, a corner sheet 116 extends from the base 90 to an end 118. The spring fingers 78b extend radially outward from the end 118 of the corner sheet 116 of the corresponding corner 106. In some alternative embodiments, one or more of the corners 106 does not include a corner sheet 116, such that the spring fingers 78b of the corner 106 extend directly from the perimeter 100 of the base 90.

As shown herein, the EMI gasket 38 generally has a rectangular shape, which is defined by the four segments 104a-d. But, the EMI gasket 38 may include any other shape, whether or not the shape of the EMI gasket 38 is complementary with the shape of the platform 70. Moreover, the EMI gasket 38 may include any other number of segments 104 besides four.

The EMI gasket 38 may be fabricated from any materials that enable the EMI gasket 38 to be electrically conductive. The EMI gasket 38 may be fabricated using any method, process, structure, means, and/or the like, such as, but not limited to, using a cutting process, using a casting process, using a die-casting process, using a molding process, using a forming process, and/or the like. Cutting processes include, but are not limited to, water cutting, stamping, laser cutting, blanking, punching, cutting using a saw, drill bit, plane, mill, and/or other solid cutting tool, and/or the like. Forming processes include, but are not limited to, drawing, bending, stamping, and/or the like. In some embodiments, the EMI gasket 38 is a cut and formed gasket that is cut from a material and then formed to include the shape of the EMI gasket 38. In some embodiments, the spring fingers 78 are integrally formed with the base 90, for example using a stamping and forming process.

Referring again to FIG. 2, the EMI gasket 38 is shown mounted to the heat sink 36. The side 94 of the base 90 of the EMI gasket 38 is engaged with the sink surface 72 of the module side 52 of the heat sink 36. More specifically, at the side 94, the segments 104a, 104b, 104c, and 104d of the EMI gasket 38 are engaged with the segments 82a, 82b, 82c, and 82d, respectively, of the sink surface 72. The engagement between the side 94 and the sink surface 72 optionally electrically connects the EMI gasket 38 to the heat sink 36. The EMI gasket 38 extends around the perimeter 88 of the platform 70. As can be seen in FIG. 2, in the exemplary embodiment, the EMI gasket 38 extends around an entirety of the perimeter 88 of the platform 70. But, the EMI gasket 38 alternatively may extend around only a portion of the perimeter 88 of the platform 70. Optionally, the EMI gasket 38 is engaged with the side walls 76 of the platform 70.

The EMI gasket 38 is optionally mechanically connected to the heat sink 36. In the exemplary embodiment, the EMI gasket 38 is mechanically connected to the heat sink 36 via an interference fit. Specifically, the interference ribs 110 (FIG. 3) of the EMI gasket engage the side walls 76 of the platform 70 with an interference fit. In addition or alternative to the interference fit, the EMI gasket 38 is optionally mechanically connected to the heat sink 36 using a fastener (such as, but not limited to, an adhesive and/or the like) and/or using a snap-fit with the side walls 76 of the platform 70. The mechanical connection between the EMI gasket 38 and the heat sink 36 optionally electrically connects the EMI gasket 38 to the heat sink 36.

Referring again to FIG. 1, the upper wall 68 of the cage 34 includes a cage surface 120 that defines the mounting side 50 of the cage 34. The cage surface 120 of the mounting side 50 includes segments 122. Namely, the cage surface 120 includes the segments 122a, 122b, 122c, and 122d. As will be described in more detail below, the segments 122 define portions of the interface 64 (FIGS. 5, 6, and 8) between the mounting side 50 of the cage 34 and the module side 52 of the heat sink 36. While the cage surface 120 includes four segments 122a, 122b, 122c, and 122d in the exemplary embodiment, the cage surface 120 may include any number of segments 122 arranged in any other shape than is shown herein, wherein such other shape may or may not be complementary with the shape of the EMI gasket 38 and/or the heat sink 36.

Figure 4:
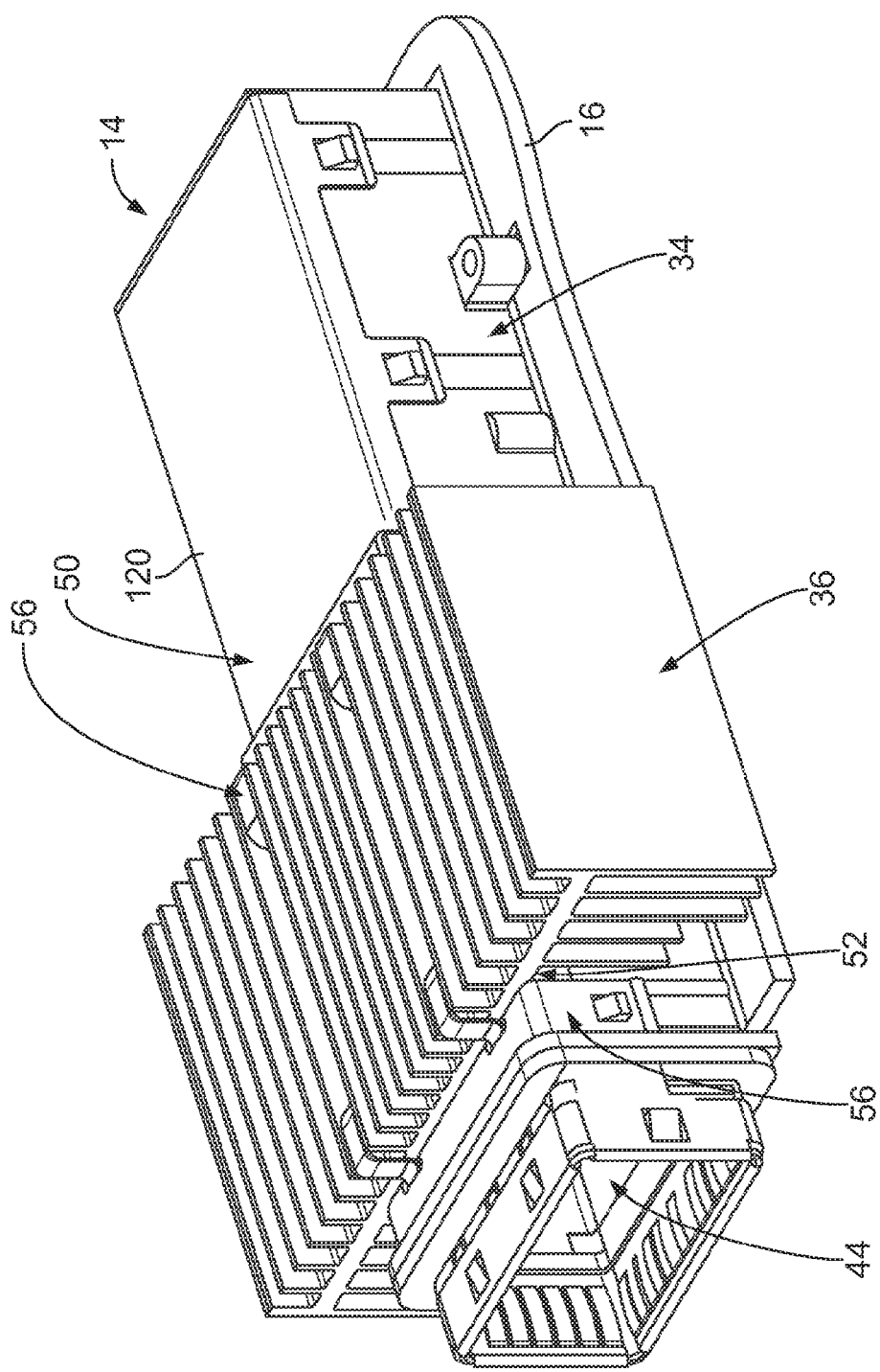
FIG. 4 is a perspective view of a portion the transceiver assembly shown in FIG. 1.

FIG. 4 is a perspective view illustrating the receptacle assembly 14 mounted on the host circuit board 16. The pluggable module 12 has been omitted from FIG. 4. FIG. 4 is an assembled view of the receptacle assembly 14 and the host circuit board 16 that illustrates the receptacle assembly 14 in a state wherein the pluggable module 12 is not mated therewith (i.e., not received or held within the internal compartment 44). The heat sink 36 is mounted to the mounting side 50 of the cage 34 using the mounting clips 56. Although not visible in FIG. 4, the platform 70 (FIGS. 2 and 7) extends through the opening 66 (FIGS. 1 and 5) within the mounting side 50 of the cage 34 and into the internal compartment 44. The module side 52 of the heat sink 36 faces the mounting side 50 of the cage 34, such that the sink surface 72 (FIGS. 2, 5, 6, and 8) of the heat sink 36 faces the cage surface 120 of the cage 34. The segments 82 (FIGS. 2, 5, 6, and 8) of the sink surface 72 face, and are at least partially aligned with, the corresponding segments 122 (FIGS. 1, 5, 6, and 8) of the cage surface 120.

Although not visible in FIG. 4, the EMI gasket 38 (FIGS. 1-3 and 5-8) is held between the mounting side 50 of the cage 34 and the module side 52 of the heat sink 36. The heat sink 36 is seated on and engaged with the EMI gasket 38. The spring fingers 78 (FIGS. 1-3 and 5-8) of the EMI gasket 38 are resiliently compressed between the mounting side 50 of the cage 34 and the module side 52 of the heat sink 36. The spring fingers 78 are engaged with, and thereby electrically connected to, the cage surface 120 of the cage 34. The position of the EMI gasket 38 between the mounting side 50 and the module side 52, the seating and engagement between the EMI gasket 38 and the heat sink 36, the compression of the spring fingers 78 between the mounting side 50 and the module side 52, and the engagement between the spring fingers 78 and the cage surface 120 will be described in more detail below with reference to FIGS. 5-8.

In some embodiments, the EMI gasket 38 is mounted to the heat sink 36 before the heat sink 36 is mounted to the cage 34. For example, the EMI gasket 38 may be mechanically connected to the heat sink 36 (e.g., as described above) or may be held on the heat sink 36 by a person and/or machine before the heat sink 36 is mounted to the cage 34. In other embodiments, the EMI gasket 38 is first positioned on the cage 34 and the heat sink 36 is thereafter mounted to the cage 34. The EMI gasket 38 is optionally mechanically connected to the mounting side 50 of the cage 34, for example as described above with respect to the optional mechanical connections of the EMI gasket 38 to the heat sink 36.

FIG. 5 is a schematic view illustrating the EMI gasket 38 as held between the mounting side 50 (not labeled in FIG. 5) of the cage 34 and the module side 52 (not labeled in FIG. 5) of the heat sink 36 when the receptacle assembly 14 is not mated with the pluggable module 12 (FIGS. 1 and 7). The interface 64 between the mounting side 50 of the cage 34 and the module side 52 of the heat sink 36 is defined from the segments 82a, 82b, 82c, and 82d of the sink surface 72 to the corresponding segments 122a, 122b, 122c, and 122d of the cage surface 94. In other words, the interface 64 is defined between the segments 82 and the corresponding segments 122.

As can be seen in FIG. 5, the segments 82a, 82b, 82c, and 82d face and are aligned with the respective segments 122a, 122b, 122c, and 122d. The interface 64 follows a path that has a radially (e.g., relative to a central axis 128) outer boundary defined by the perimeter edge 84 of the heat sink 36. Side edges 124 (also labeled in FIG. 1) of the mounting side 50 of the cage 34 also define the radially outer boundary of the path of the interface 64. Although shown as being aligned with the corresponding segments of the perimeter edge 84 of the sink surface 72 of the heat sink 36, alternatively one or both of the side edges 124 may not be aligned with the corresponding segment of the perimeter edge 84. The interface 64 follows a path that has a radially inner boundary defined by an interior edge 130 (also labeled in FIG. 1) that defines the opening 66 of the cage 34. The interface 64 thus extends around the opening 66. In the exemplary embodiment, the interface 64 generally follows a rectangular path, but the interface 64 may follow any other shaped path, which may or may not be complementary with the shape of the EMI gasket 38, the cage 34, and/or the heat sink 36.

FIG. 6 is a cross-sectional view taken along line 6-6 of FIG. 4 and also illustrating the EMI gasket 38 held between the heat sink 36 and the cage 34 when the receptacle assembly 14 is not mated with the pluggable module 12 (FIGS. 1 and 7). As can be seen in FIG. 6, the EMI gasket 38 is held between the mounting side 50 of the cage 34 and the module side 52 of the heat sink 36. The side 94 of the base 90 of the EMI gasket 38 is engaged with the sink surface 72 of the module side 52 of the heat sink 36 when the receptacle assembly 14 is not mated with the pluggable module 12. The spring fingers 78 have been resiliently deflected in the direction of the arrow A such that the spring fingers 78 are resiliently compressed between the heat sink 36 and the cage 34. The interfaces 114 of the spring fingers 78 are engaged with the cage surface 120 such that the spring fingers 78 are, and thus the EMI gasket 38 is, electrically connected to the cage 34 along the interface 64. The interface 64 includes a gap $G_1$ between the mounting side 50 of the cage 34 and the module side 52 of the heat sink 36. More specifically, the gap $G_1$ extends from the segments 82 of the sink surface 72 to the corresponding segments 122 of the cage surface 120. The spring fingers 78 may be compressed by any amount when the receptacle assembly 14 is not mated with the pluggable module 12.

Referring again to FIG. 5, the EMI gasket 38 extends along the interface 64. More specifically, the spring fingers 78 extend along the respective segments 82*a*, 82*b*, 82*c*, and 82*d* of the heat sink 36 and along the respective segments 122*a*, 122*b*, 122*c*, and 122*d* of the cage 34. The EMI gasket 38 extends along the radially inner and outer boundaries of the interface 64. In the exemplary embodiment, the EMI gasket 38 extends along an entirety of the path of the interface 64, but the EMI gasket 38 alternatively may extend along only one or more portions of the path of the interface 64.

In the exemplary embodiment, the EMI gasket 38 extends along the interface 64 within the interface 64. In other words, the EMI gasket 38 is disposed between the radially inner and radially outer boundaries of the interface 64. In some embodiments, a portion of the EMI gasket 38 is disposed outside the interface 64 (i.e., radially outside the radially outer boundary of the interface 64). Moreover, in some embodiments, a portion of the EMI gasket 38 is disposed inside the interface 64 (i.e., radially inside the radially inner boundary of the interface 64).

FIG. 7 is a cross-sectional view of the transceiver assembly 10 illustrating the receptacle assembly 14 in a state wherein the pluggable module 12 is mated therewith (i.e., is received and held within the internal compartment 44). As the pluggable module 12 is inserted into the internal compartment 44 of the cage 34, engagement between the module 12 and the platform 70 of the heat sink 36 moves the heat sink 36 such that the module side 52 of the heat sink 36 moves in a direction away from the mounting side 50 of the cage 34, which is indicated by the arrow B in FIG. 7. In embodiments wherein the heat sink 36 and the pluggable module 12 thermally communicate via a thermal interface material, engagement of the thermal interface material with the module 12 or the heat sink 36 may cause the movement of the heat sink 36 relative to the cage 34.

FIG. 8 is a cross-sectional view along line 8-8 of FIG. 7. When the pluggable module 12 (FIGS. 1 and 7) is mated with the receptacle assembly 14, the EMI gasket 38 is held between the mounting side 50 of the cage 34 and the module side 52 of the heat sink 36. The movement of the heat sink 36 relative to the cage 34 causes the spring fingers 78 of the EMI gasket 38 to at least partially uncompress by any amount. Accordingly, and as can be seen from a comparison of FIGS. 6 and 8, the spring fingers 78 are compressed a greater amount when the pluggable module 12 is not mated with the receptacle assembly 14 and are compressed a lesser amount when the pluggable module 12 is mated with the receptacle assembly 14.

When the pluggable module 12 is mated with the receptacle assembly 14, the side 94 of the base 90 of the EMI gasket 38 is engaged with the sink surface 72 of the module side 52 of the heat sink 36. The spring fingers 78 are resiliently compressed between the heat sink 36 and the cage 34. The interfaces 114 of the spring fingers 78 are engaged with the cage surface 120 such that the spring fingers 78 are, and thus the EMI gasket 38 is, electrically connected to the cage 34 along the interface 64. The interface 64 includes a gap $G_2$ between the mounting side 50 of the cage 34 and the module side 52 of the heat sink 36. More specifically, the gap $G_2$ extends from the segments 82 of the sink surface 72 to the corresponding segments 122 of the cage surface 120. As should be apparent from a comparison of FIGS. 6 and 8, the gap $G_2$ is greater than the gap $G_1$. The spring fingers 78 may be compressed by any amount when the receptacle assembly 14 is mated with the pluggable module 12.

As should be apparent from the above description as well as the Figures, when the pluggable module 12 is mated with the receptacle assembly 14, the EMI gasket 38 extends along the interface 64 in a substantially similar manner to that described above when the pluggable module 12 is not mated with the receptacle assembly 14.

The EMI gasket 38 facilitates blocking EMI emissions from leaking out from the interior compartment 44 of the cage 34 through the interface 64. More specifically, EMI gasket 38 facilitates blocking EMI emissions from leaking out from the interior compartment 44 (FIGS. 1 and 7) between the sink surface 72 of the heat sink 36 and the cage surface 120 of the cage 34.

The spring fingers 78 may be capable of retaining the resilience thereof through a wide variety of temperature ranges, temperature extremes, and/or the like. For example, the spring fingers 78 may retain the resilience thereof through a temperature range of between approximately −25° C. and approximately 150° C., above an approximate temperature of −25° C., and/or below an approximate temperature of 150° C. The ability of the spring fingers 78 to retain the resilience thereof through a wide variety of temperature ranges, temperature extremes, and/or the like may facilitate preventing mechanical failure of the EMI gasket 38. For example, the ability of the spring fingers 78 to retain the resilience thereof through a wide variety of temperature ranges, temperature extremes, and/or the like may facilitate preventing the spring fingers 78 from losing of the ability to remain engaged with the cage 34 when the pluggable module 12 forces the heat sink 36 to move in the direction of the arrow B in FIG. 7. The EMI gasket 38 may be capable of retaining the electrically conductivity thereof through a wide variety of temperature ranges, temperature extremes, and/or the like. For example, the EMI gasket 38 may retain the electrical conductivity thereof through a temperature range of between approximately −25° C. and approximately 150° C., above an approximate temperature of −25° C., and/or below an approximate temperature of 150° C.

The embodiments described and/or illustrated herein may provide a transceiver assembly that experiences a reduced amount of leakage of EMI emissions from between an interface between a cage and a heat sink of the transceiver assembly.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cage assembly for receiving a pluggable module, the cage assembly comprising:
   a cage having a front end, a mounting side, and an internal compartment, the front end being open to the internal compartment of the cage, the internal compartment being configured to receive the pluggable module therein through the front end;
   a heat sink mounted to the mounting side of the cage, the heat sink having a module side that is configured to thermally communicate with the pluggable module; and
   an electromagnetic interference (EMI) gasket extending along at least a portion of an interface between the mounting side of the cage and the module side of the heat sink, the EMI gasket comprising electrically conductive spring fingers that are engaged with and electrically connected to the mounting side of the cage.

2. The assembly of claim 1, wherein the EMI gasket is positioned to block EMI leakage at the interface between the mounting side of the cage and the module side of the heat sink.

3. The assembly of claim 1, wherein the EMI gasket comprises a base having a perimeter, the spring fingers extending radially outward from the base along at least a portion of the perimeter.

4. The assembly of claim 1, wherein the EMI gasket comprises a base having a perimeter that includes a corner, the spring fingers comprising a corner spring finger that extends from the base at the corner of the perimeter.

5. The assembly of claim 1, wherein the EMI gasket comprises a base having a perimeter that includes a corner, the spring fingers comprising a plurality of corner spring fingers that extend along the corner in a fan-shaped pattern.

6. The assembly of claim 1, wherein the EMI gasket comprises a base having a perimeter that includes a corner, the spring fingers comprising a corner spring finger that extends from the base at the corner of the perimeter, the corner spring finger extending from the base at an oblique angle relative to at least one other spring finger.

7. The assembly of claim 1, wherein the EMI gasket comprises a base having a perimeter that includes a corner, the EMI gasket further comprising a corner sheet that extends from the base at the corner of the perimeter to an end, the spring fingers comprising a plurality of corner spring fingers that extend from the end of the corner sheet.

8. The assembly of claim 1, wherein the EMI gasket comprises a base having first and second segments, an end of the first segment being interconnected to an end of the second segment at a corner, the spring fingers comprising end spring fingers that extend from the base at the ends of the first and second segments, the corner comprising a gap between the end spring fingers, wherein the spring fingers comprise a corner spring finger that extends within the gap between the end spring fingers.

9. The assembly of claim 1, wherein the spring fingers of the EMI gasket are resiliently compressible between the mounting side of the cage and the module side of the heat sink.

10. The assembly of claim 1, wherein the mounting side of the cage comprises an opening extending therethrough, the interface between the module side of the heat sink and the mounting side of the cage extending around the opening, the module side of the heat sink comprising a platform that extends into the opening, the platform having a module surface that is configured to thermally communicate with the pluggable module, the EMI gasket extending along the interface around at least a portion of a perimeter of the platform.

11. The assembly of claim 1, wherein the EMI gasket comprises a base that is engaged with the module side of the heat sink.

12. The assembly of claim 1, wherein the heat sink is seated on, and engages, the EMI gasket.

13. The assembly of claim 1, wherein the EMI gasket is mechanically connected to the module side of the heat sink using an interference-fit connection.

14. The assembly of claim 1, wherein the interface between the mounting side of the cage and the module side of the heat sink comprises a gap between the mounting and module sides.

15. A receptacle assembly for mating with a pluggable module, the receptacle assembly comprising:
   a receptacle connector; and
   a cage having a front end, a mounting side, and an internal compartment, the receptacle connector being held within the internal compartment, the front end being open to the internal compartment of the cage, the internal compartment being configured to receive the pluggable module therein through the front end;
   a heat sink mounted to the mounting side of the cage, the heat sink having a module side that is configured to thermally communicate with the pluggable module; and
   an electromagnetic interference (EMI) gasket extending along at least a portion of an interface between the mounting side of the cage and the module side of the heat sink, the EMI gasket comprising electrically conductive spring fingers that are engaged with and electrically connected to the mounting side of the cage.

16. The assembly of claim 15, wherein the EMI gasket comprises a base having a perimeter that includes a corner, the spring fingers comprising a corner spring finger that extends from the base at the corner of the perimeter.

17. The assembly of claim 15, wherein the EMI gasket comprises a base having a perimeter, the spring fingers extending radially outward from the base along at least a portion of the perimeter.

18. The assembly of claim 15, wherein the spring fingers of the EMI gasket are resiliently compressible between the mounting side of the cage and the module side of the heat sink.

19. A cage assembly for receiving a pluggable module, the cage assembly comprising:
   a cage having a front end, a mounting side, and an internal compartment, the front end being open to the internal compartment of the cage, the internal compartment being configured to receive the pluggable module therein through the front end;
   a heat sink mounted to the mounting side of the cage, the heat sink having a module side that is configured to thermally communicate with the pluggable module; and
   an electromagnetic interference (EMI) gasket extending along at least a portion of an interface between the mounting side of the cage and the module side of the heat sink, the EMI gasket comprising a base having a perimeter that includes a corner, the EMI gasket further comprising electrically conductive spring fingers that extend from the base and are engaged with and electrically connected to the mounting side of the cage, wherein the spring fingers comprise a corner spring finger that extends from the base at the corner of the perimeter.

20. The assembly of claim 19, wherein the corner spring finger comprises a plurality of corner spring fingers that extend along the corner in a fan-shaped pattern.

\* \* \* \* \*